(12) United States Patent
Rankin

(10) Patent No.: US 6,492,900 B2
(45) Date of Patent: Dec. 10, 2002

(54) ROTARY SWITCH TEST SENSOR

(75) Inventor: Brent C. Rankin, Lima, OH (US)

(73) Assignee: Honda of America Manufacturing, Inc., Marysville, OH (US)

( * ) Notice: Subject to any disclaimer, the term of this patent is extended or adjusted under 35 U.S.C. 154(b) by 0 days.

(21) Appl. No.: 10/080,172

(22) Filed: Feb. 19, 2002

(65) Prior Publication Data

US 2002/0130020 A1 Sep. 19, 2002

Related U.S. Application Data

(63) Continuation of application No. 09/537,464, filed on Mar. 27, 2000, now abandoned, and a division of application No. 09/344,461, filed on Jun. 25, 1999, now abandoned.

(51) Int. Cl.$^7$ ................................................. B60Q 1/00
(52) U.S. Cl. ................ 340/456; 340/686.1; 340/686.2; 340/686.3; 340/438; 73/116
(58) Field of Search .............................. 340/686.1, 456, 340/438, 686.2, 686.3; 701/51; 477/34; 73/116, 118

(56) References Cited

U.S. PATENT DOCUMENTS

| | | | |
|---|---|---|---|
| 4,640,294 A | 2/1987 | Ordo | 190/70.2 |
| 4,642,771 A | 2/1987 | Asagi et al. | 701/62 |
| 4,823,596 A | 4/1989 | Myers et al. | 73/118.1 |
| 4,843,708 A | 7/1989 | Yokoi et al. | 29/407.04 |
| 4,843,915 A | 7/1989 | Sugimura et al. | 74/862 |
| 4,887,344 A | 12/1989 | Kurihara | 29/468 |
| 5,088,353 A | 2/1992 | Yoshida | 74/866 |
| 5,561,416 A | 10/1996 | Marshall et al. | 340/456 |
| 5,601,513 A | 2/1997 | Arai et al. | 477/115 |
| 5,718,043 A | 2/1998 | Pearson | 29/889.5 |
| 5,794,339 A | 8/1998 | Pearson et al. | 29/889.5 |
| 5,908,369 A | 6/1999 | Nakauchi | 477/125 |
| 6,021,368 A | 2/2000 | Taniguchi | 701/51 |
| 6,073,507 A | 6/2000 | Ota et al. | 74/335 |

Primary Examiner—Julie Lieu
(74) Attorney, Agent, or Firm—Barbara Joan Haushalter; Alan T. McDonald

(57) ABSTRACT

A sensor device is used for sensing position of a movable component. The sensor device can be applied to multiple applications. For example, proper alignment between a shifter spline and a shifter position sensor of a transmission assembly can be confirmed by applying the sensor device of the present invention to confirm alignment of the transmission shifter with a transmission shifter position sensor during transmission assembly. A rotary sensor converts angular movement to a proportional electrical output. A converter then converts the proportional electrical output to an input which can be read. The location of the movable component is then determined, and displayed.

4 Claims, 4 Drawing Sheets

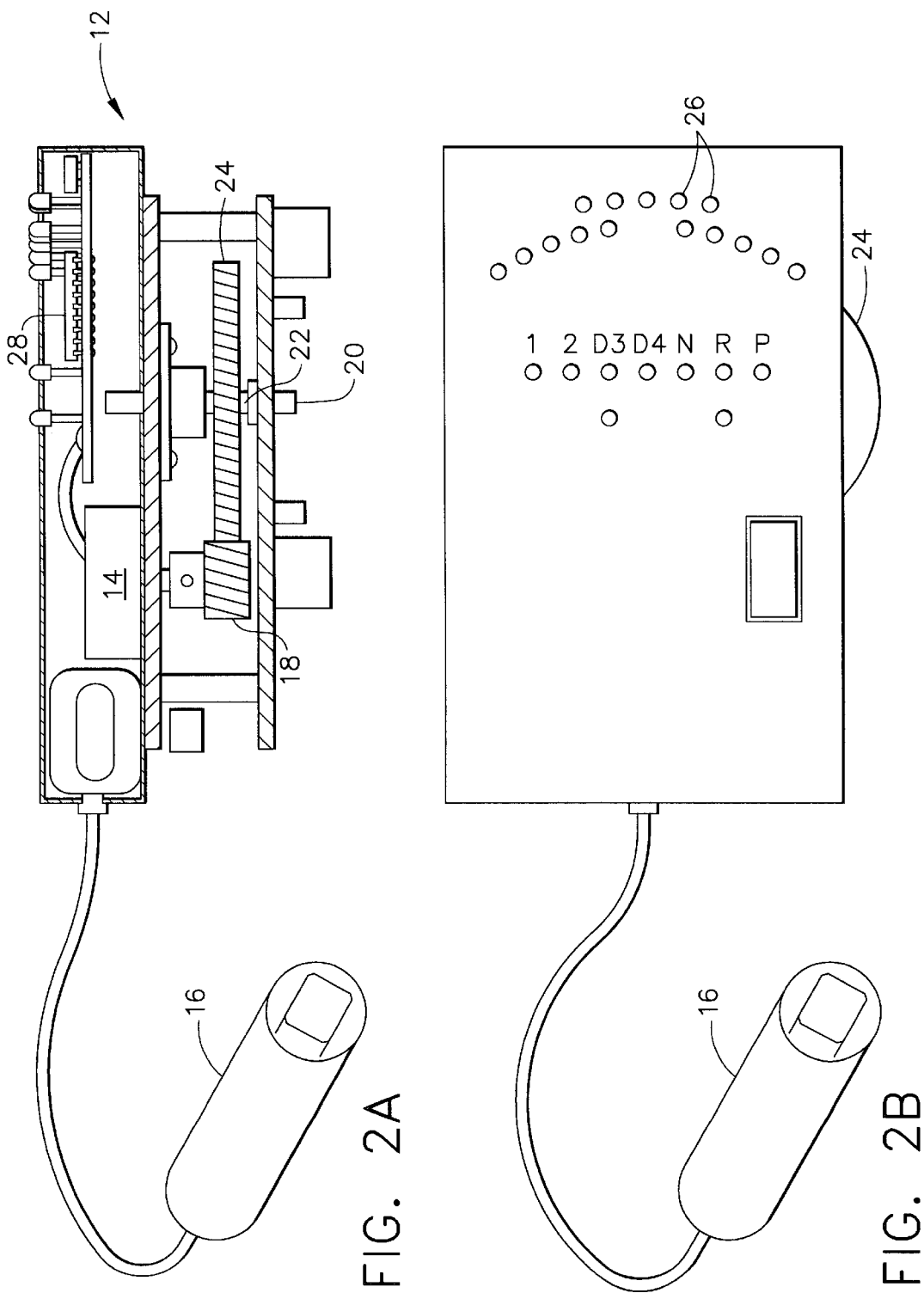

ROTARY SWITCH TEST SENSOR

This application is a continuation of application Ser. No. 09/537,464, filed Mar. 27, 2000, now abandoned, and a divisional of application Ser. No. 09/344,461, filed Jun. 25, 1999, now abandoned.

FIELD OF THE INVENTION

This invention relates generally to a vehicle automatic transmission, and more particularly, to positioning of the vehicle automatic transmission shifter.

BACKGROUND OF THE INVENTION

During vehicle assembly, a torque converter case assembly is assembled to a transmission subassembly. To properly accomplish this assembly, internal splines of the torque converter case must be aligned with the external splines, or transmission shifter, which is connected to the shifter position sensor. Currently, this process is accomplished manually, wherein an assembler lowers a torque converter onto a transmission, with the torque converter generally appearing to be centered about the transmission splines. The assembler manipulates the interface structures until all of the splines align and the torque converter drops into place, and then installs the shifter position sensor.

Therefore, among the purposes of this invention is to provide a sensor means for automatically sensing whether a transmission shifter is properly aligned with the shifter position sensor of the transmission.

Also a purpose of this invention is to confirm the integrity of each contact in the transmission shifter position sensor.

SUMMARY OF THE INVENTION

These purposes are achieved by the transmission shifter position sensor system and method according to the present invention, wherein automatic determination of proper alignment of the shifter with the transmission shifter position sensor is determined during vehicle assembly.

In accordance with one embodiment of the present invention, a sensor device is provided for sensing the position of a movable component. The sensor device comprises a rotary sensor for converting angular movement to a proportional electrical output. A converter then converts the proportional electrical output to an input, which is read by an input reading means. The location of the movable component is determined and indicated on a display means.

For example, the sensor device can be used when aligning a transmission shifter with a transmission shifter position sensor during transmission assembly. It is necessary for the wiper contact of the transmission shift position sensor to be as close as possible to the center of the neutral contact, to eliminate the possibility of the wiper contact being offset to the point that it no longer makes contact with the neutral contact when the transmission shifter is in the neutral position. Since, the shifter cable has a tendency to offset the shifter, the sensor device of the present invention is useful for automatically sensing whether a transmission shifter is properly aligned with the shifter position sensor.

The primary advantage provided by the present invention is to confirm the location of a movable component, and can be applied to confirm proper alignment between the shifter spline and the shifter position sensor.

Other objects and advantages of the invention will be apparent from the following description, the accompanying drawings and the appended claims, to which reference may be had for a full understanding of the nature of the present invention.

BRIEF DESCRIPTION OF THE DRAWINGS

In the Drawings:

FIGS. 2A and 2B are side and top views, respectively, of a schematic block diagram of the rotary switch test device of the present invention, for sensing the position of the shifter position sensor with respect to the transmission's shifter spline.

DESCRIPTION OF THE PREFERRED EMBODIMENT

A test device or sensor device is provided for sensing the position of a movable component. The sensing device of the present invention is described herein with reference to a transmission assembly, but it is to be understood that the sensor device can be applied in multiple other applications as well.

In a transmission assembly application, a rotary sensor can be used to convert angular movement to a proportional electrical output, and a converter can then convert the output to a computer-acceptable input. A computer, or input reading means, reads the input and applies the necessary programmed algorithms to determine the location of the movable component, or switch. The switch location is converted to a display format, and a display means displays the results.

The sensor device of the present invention can be applied to a number of applications such as, for example, to automatically sense whether the transmission shifter is properly aligned with the shifter position sensor in a transmission assembly. In accordance with one aspect of the present invention, the sensor device or mechanical pickup, such as a keyed shaft, connects to the rotating portion of the switch (i.e., the shifter position sensor) under test. The shaft is connected to a device that converts the rotary position into a proportional electrical signal. When the moveable electrical contact component of the unit under test first contacts the edge of the electrical switch contact, the angular position of the contact edge position is read and stored. The edge position value is subtracted from any subsequent readings and the resultant value indicates the real-time position of the moveable switch on the electrical contact.

Figure 1:
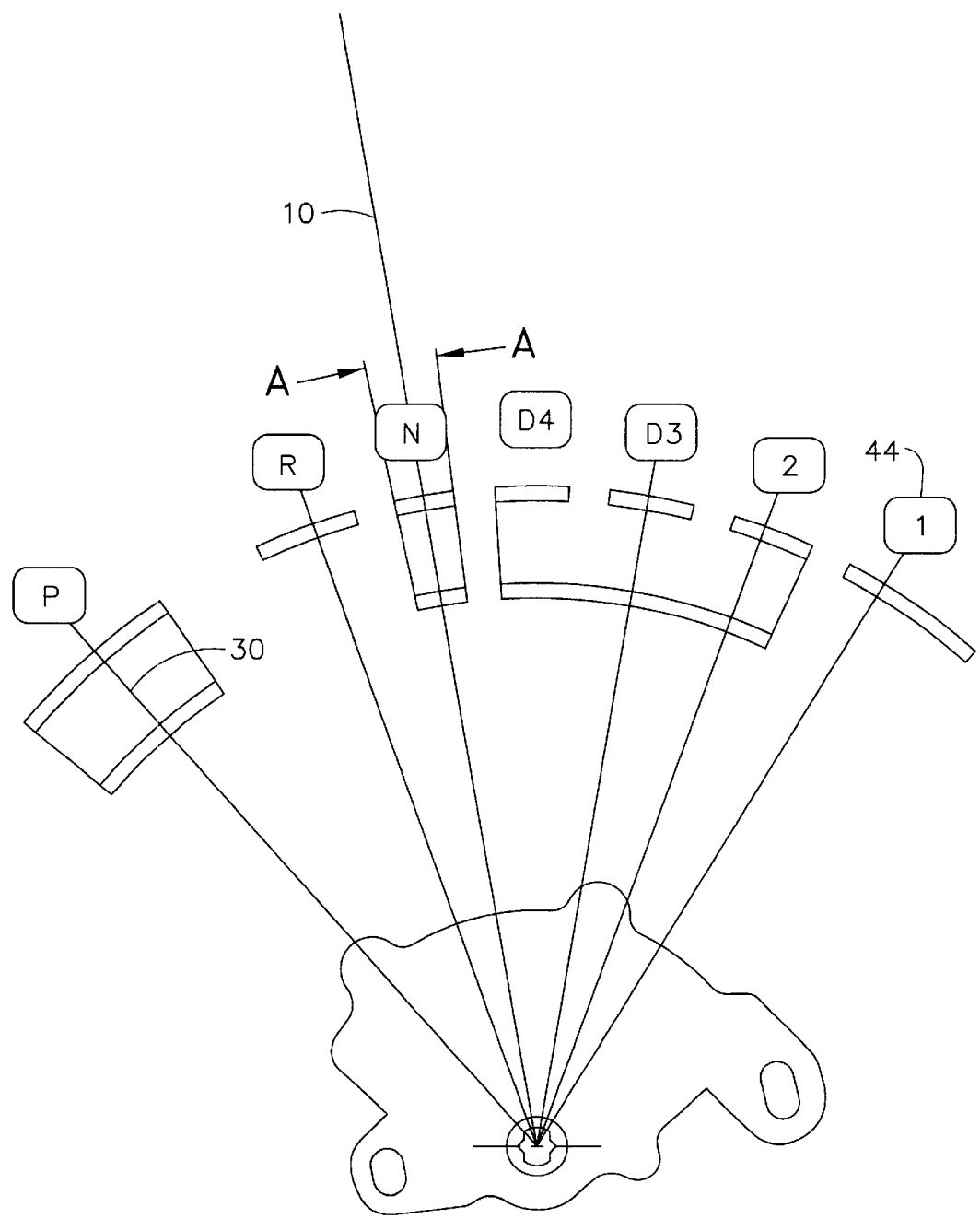
FIG. 1 illustrates the positions for a transmission shifter position sensor of a vehicle.

For example, as illustrated in FIG. 1, one application of the test device of the present invention is to determine the location and indicate the center of the neutral position electric contact on a transmission, to determine adjustment accuracy. As a driver shifts through park P, reverse R, neutral N, fourth, third, second and first gears, the output is required to indicate the true location of the switch within the multiple gears. When a "neutral" position is indicated for a driver, the transmission is preferably located along datum line 10. If the transmission is in the neutral zone, and a neutral reading is not indicated, then adjustment is necessary to bring the transmission into proper alignment.

Accuracy is determined by the precision and resolution of the device that confirms that the rotation of the movable component or wiper in the shift position sensor switch is within ±½ of a degree from the datum line. If the rotation is within this window, then no adjustment to the unit being tested is required; however, if the wiper is greater than ±½ degree from the datum line, adjustment is required.

Referring now to FIGS. 2A and 2B, the position sensor testing device 12 scales and interfaces the rotation of the transmission position sensor 34 to a precision rotating sensor. A positive voltage is connected to a first terminal of test plug 16, and ground potential (0 volts) is connected to a second terminal. A third terminal provides the output voltage of the rotating sensor. This voltage will represent absolute position which is shown on the position display LEDs, representative of the position contacts shown in FIG. 1. The position display module 28 monitors for the edge of the park P position contact, the neutral N position contact, and converts the absolute position voltage to an output format that drives the position display LEDs 26.

A rotation transfer shaft 20 is shaped to fit inside a transmission position sensor shaft socket 45 in FIG. 1, which is connected to the movable component whose position is being sensed, which is located inside the position sensor. The rotation transfer shaft 20 rotates as the transmission control shaft rotates. A larger main drive gear 24 drives a smaller secondary gear 18, which is connected to the precision rotating sensor 14. As the precision rotating sensor 14 rotates, the absolute position voltage on the third terminal changes proportionally. An analog-to-digital converter associated with the position display module 28 converts the absolute position voltage to a digital representation. The position display module 28 can use a pre-programmed algorithm to convert the absolute position voltage, along with a digital input from the neutral contact N of the sensor 14, to a binary output which represents the real-time position of the moveable component in relation to the neutral position contact.

Figure 3A:
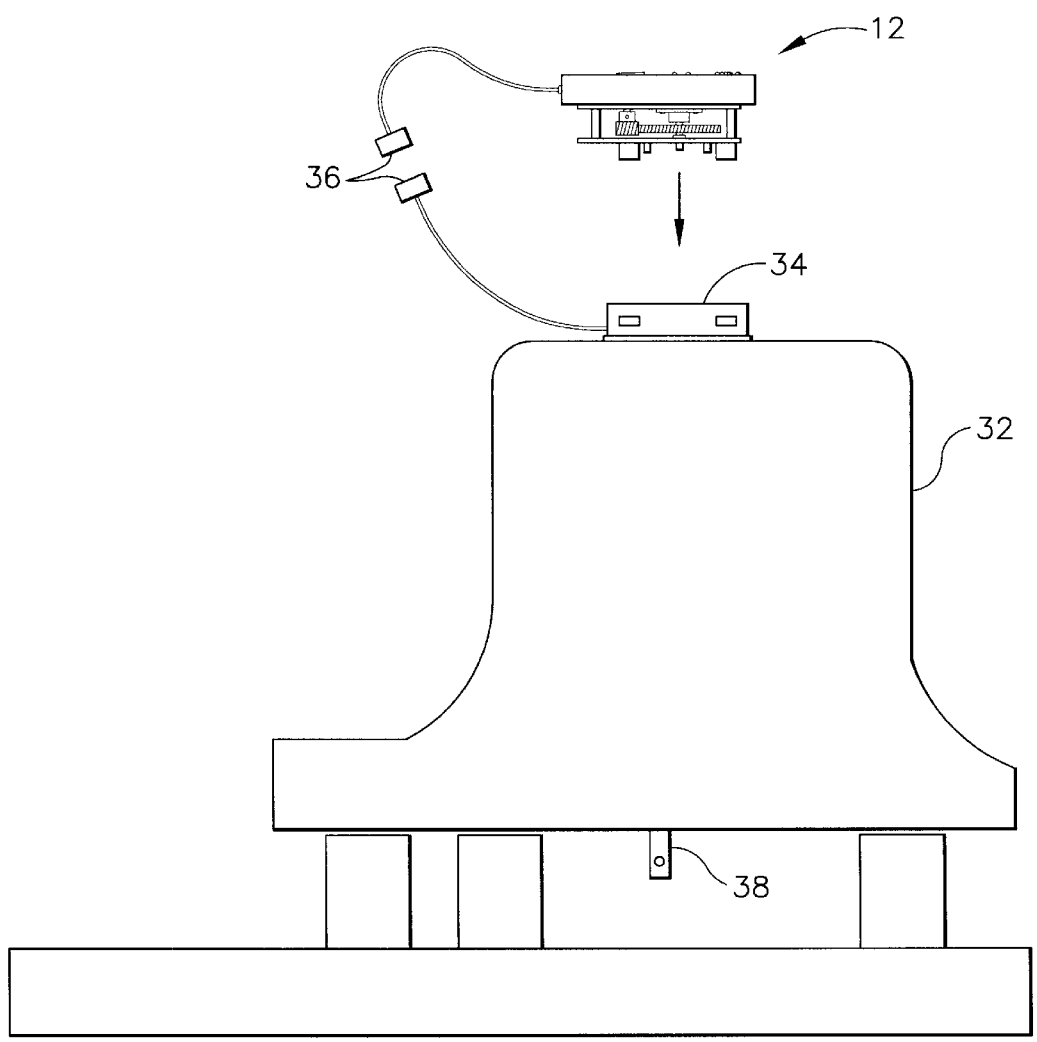
FIGS. 3A and 3B illustrate application of the rotary switch test device of FIGS. 2A and 2B, applied to a vehicle transmission.
Figure 3B:
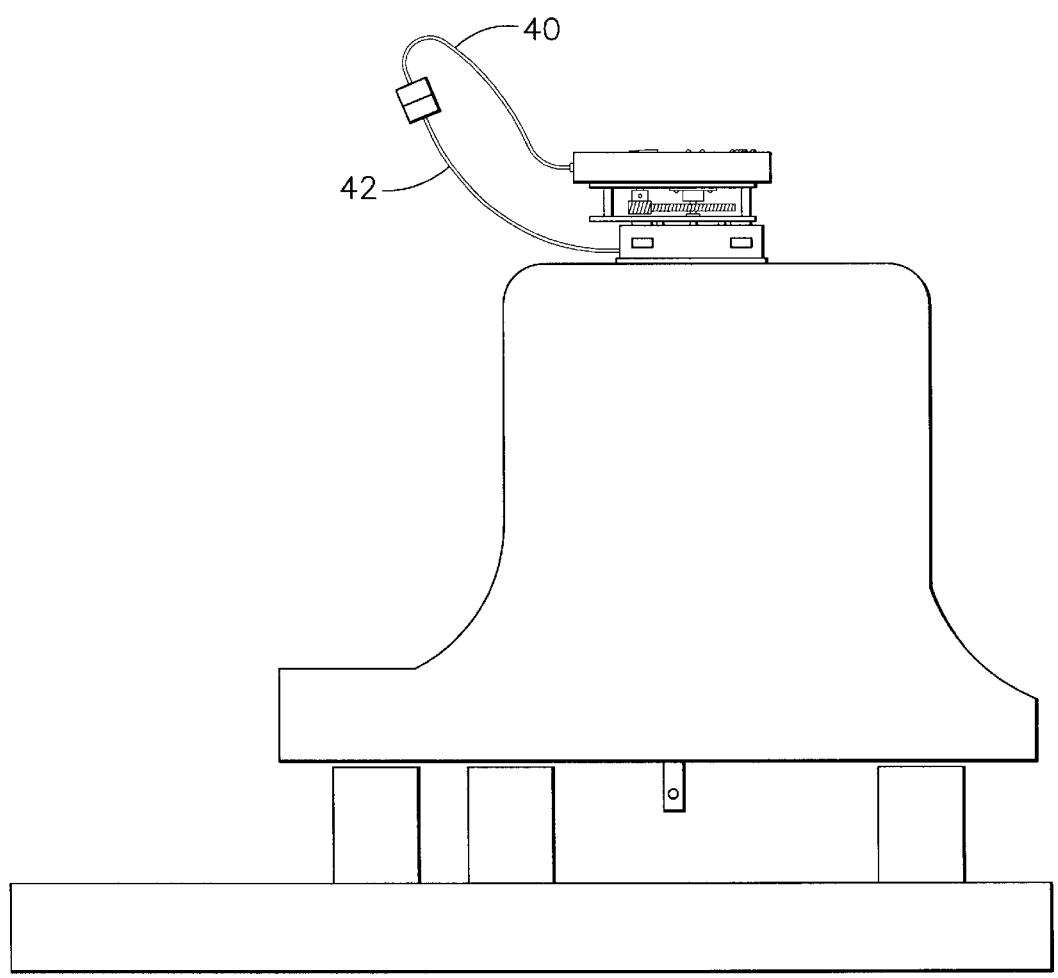

Once park P line 30 of FIG. 1 is made active, by placing the transmission in the park position, internal counters and variables are reset to zero, or beginning values. Then the neutral line 10 can go active, by placing the transmission in neutral. As illustrated in FIGS. 3A and 3B, the sensor device 12 is applied to a transmission shift position sensor 34 at connection ports 36. The shift control shaft 38 is moved through the shift positions during the test.

As soon as the movable component or gear shift 38 moves the position sensor 34 to make contact with the neutral zone A, the voltage at the analog-to-digital converter input is read. The result is stored as a variable, which represents the real-time position of the beginning edge of the neutral zone or neutral contact. This stored beginning position is subtracted from any other absolute position voltage readings that are taken during the time that the moveable component is in contact with the neutral contact. The result of the position calculation is converted to a binary representation and output to an input/output port which is connected to the display circuit. If at any time the position sensors park contact 30 is made active, by putting the transmission in park, the system is reset and waits for the neutral contact 10 to go active, beginning a new measuring cycle.

In operation, the shift position sensor 34 is placed on the transmission 32, and attached with suitable means such as fastening bolts. The operator adjusts the position sensor 34 to a presumed correct position, and commences with the attachment. The position sensor tester 12 is placed on top of the position sensor 34, as indicated in FIG. 3B, and connection is made between cables 40 and 42. The transmission is shifted from park P to first 44, and back to neutral N position. The position sensor tester 12 displays the location of the gear shift 38 in reference to the neutral position contact, and condition of contacts. The tester 12 can output certain conditions, indicative, for example, of a position which is less than ±½ degree of rotation; a position which is greater than ±½ degree of rotation; and a position which is greater than ±1 degree of rotation. When the test is complete, the tester unit 12 is removed from the transmission 32.

It is necessary for the wiper contact of the shift position sensor 34 to be as close as possible to the center of the neutral contact, as indicated by the datum line in FIG. 1. This eliminates the possibility of the wiper contact being offset to the point that it no longer makes contact with the neutral contact, when the transmission shifter is in the neutral position. This situation occurs when the shifter cable is connected to the transmission, during vehicle assembly. Since the cable has a tendency to pull or push and thereby offset the shifter, the technique of present invention can be applied to correct this problem.

Having described the invention in detail and by reference to the preferred embodiment thereof, it will be apparent that other modifications and variations are possible without departing from the scope of the invention defined in the appended claims. In particular, the sensor device described herein can be applied in multiple applications for determining the position of a movable component, as part of a transmission assembly or other application.

What is claimed is:

1. A removable sensor device for sensing whether a transmission shifter is properly aligned with a shifter position sensor during assembly of a transmission, the sensor device not forming a part of the transmission and comprising:

rotatable means for temporarily attaching the sensor device to the shifter position sensor during said sensing;

a rotary sensor for converting angular movement of the rotatable means to a proportional electrical output;

a converter for converting the proportional electrical output to an input;

an input reading means for reading the input;

means for determining and indicating a location of the transmission shifter; and display means for displaying the location of the transmission shifter.

2. A sensor device as claimed in claim 1 wherein the shifter position sensor is capable of determining location and indicating a center of a neutral position for the transmission shifter.

3. A sensor device as claimed in claim 2 wherein rotation of the transmission shifter is within ±½ of a degree from a datum line.

4. A sensor device as claimed in claim 1 wherein the input reading means comprises a computer.

* * * * *